(12) United States Patent
Ohmart et al.

(10) Patent No.: US 11,573,266 B2
(45) Date of Patent: Feb. 7, 2023

(54) ELECTRONIC DEVICE TEMPERATURE TEST ON STRIP FILM FRAMES

(71) Applicant: Texas Instruments Incorporated, Dallas, TX (US)

(72) Inventors: Dale Ohmart, Richmond, TX (US); Marshall Worrall, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/029,988

(22) Filed: Sep. 23, 2020

(65) Prior Publication Data
US 2021/0199712 A1   Jul. 1, 2021

Related U.S. Application Data

(60) Provisional application No. 62/954,773, filed on Dec. 30, 2019.

(51) Int. Cl.
*G01R 31/28*   (2006.01)
*G01R 1/073*   (2006.01)
*H01L 23/34*   (2006.01)

(52) U.S. Cl.
CPC ..... *G01R 31/2891* (2013.01); *G01R 1/07307* (2013.01); *H01L 23/345* (2013.01)

(58) Field of Classification Search
CPC .............. G01R 31/002; G01R 31/2856; G01R 31/2875; G01R 31/2877; G01R 31/2874
See application file for complete search history.

(56) References Cited

U.S. PATENT DOCUMENTS

| | | | |
|---|---|---|---|
| 2006/0208721 A1* | 9/2006 | Soeta | G01R 31/2865 324/750.05 |
| 2018/0074118 A1 | 3/2018 | Worrall et al. | |
| 2018/0374798 A1* | 12/2018 | Lee | H01L 21/4853 |

* cited by examiner

*Primary Examiner* — Tung X Nguyen
(74) *Attorney, Agent, or Firm* — Ronald O. Neerings; Frank D. Cimino

(57) ABSTRACT

A system includes a platform and a contactor. The platform has a side configured to support a frame with a carrier structure and electronic devices each having first and second sides and a terminal, the first side positioned on the carrier structure, and the terminal exposed in a first portion of the second side. The contactor has first and second sides, a contact and a heater. The contact is exposed on the first side of the contactor to contact the terminal in a first portion of the second side of a selected one of the electronic devices, and the heater is exposed on the first side of the contactor to apply heat to a second portion of the second side of the selected one of the electronic devices.

22 Claims, 11 Drawing Sheets

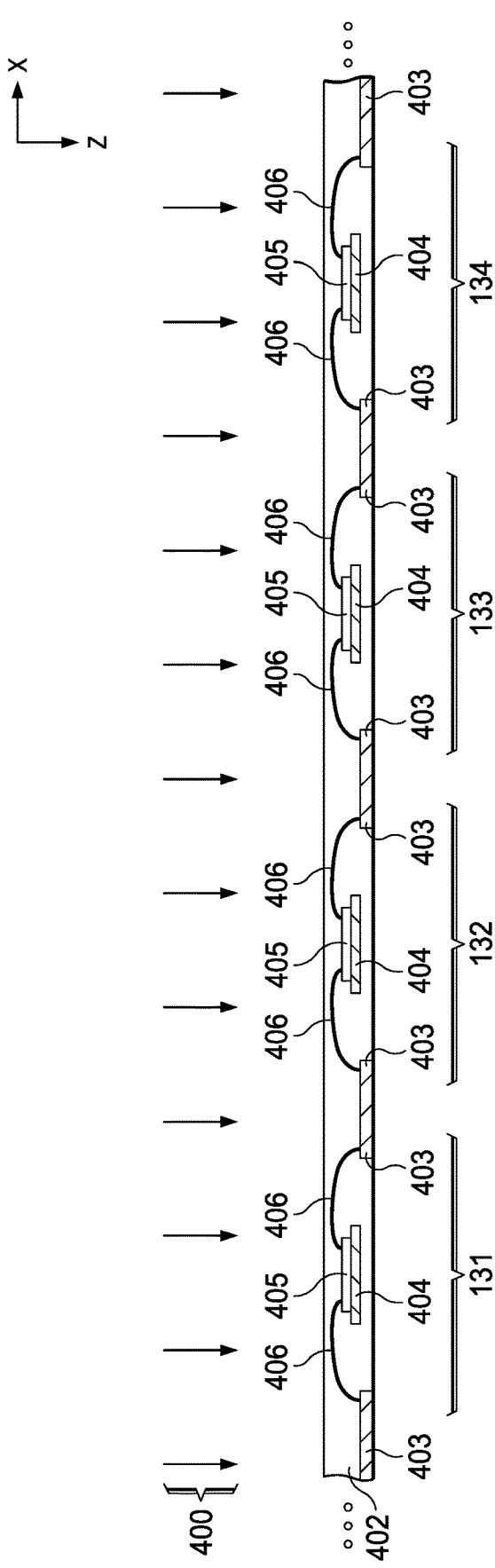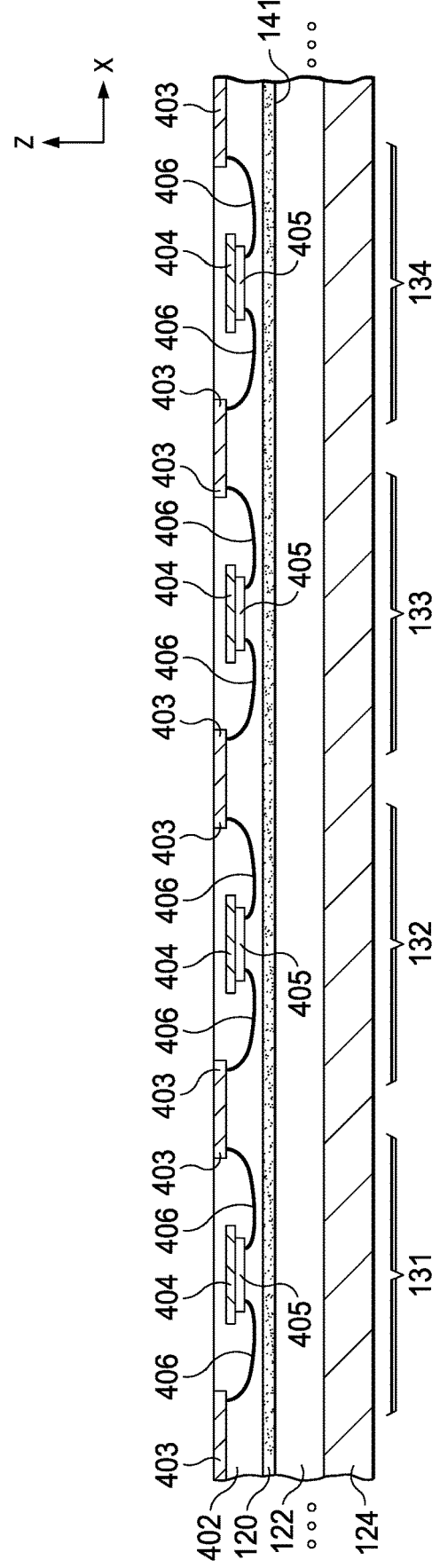

ELECTRONIC DEVICE TEMPERATURE TEST ON STRIP FILM FRAMES

CROSS-REFERENCE TO RELATED APPLICATION

This application claims priority to, and the benefit of, U.S. provisional patent application No. 62/954,773, entitled "A Method For Temperature Test of QFN Parts On Strip Film Frames", and filed on Dec. 30, 2019, the entirety of which is hereby incorporated by reference.

BACKGROUND

Efficient testing of manufactured electronic devices at non-ambient temperature is difficult for small packages, such as quad flat no-lead (QFN) devices less than 3 mm×3 mm. Final testing can be done using turret handlers or other pick and place apparatus, or as an array of devices on film frame strip handlers. QFN and other device topologies must be singulated prior to final electrical testing due to the nature of the lead frame used in forming the device leads. Turret handlers are undesirable for testing large numbers of small devices. Final testing of small devices can be done in strip form using film frame strip handlers. The semiconductor dies are positioned on die attach pads of a lead frame strip, and wire bonding is performed on the strip. The parts are molded and the QFN strip is placed on adhesive tape. The devices are saw singulated while the tape holds the units in place for testing in strip form. Testing at non-ambient temperatures is difficult for strip testing, however, as heating the film frame causes stretching, wrinkling stress and damage to the tape, as well as lost device units.

SUMMARY

In accordance with one aspect, a system is provided having a platform and a contactor. The platform has a side configured to support a frame with a carrier structure and electronic devices. The electronic devices have a first side positioned on the carrier structure, and a terminal exposed in a first portion of a second side. The contactor has a contact and a heater. The contact is exposed on a first side of the contactor to contact the terminal in a first portion of the second side of a selected one of the electronic devices, and the heater is exposed on the first side of the contactor to contact and apply heat to a second portion of the second side of the selected electronic device.

In accordance with another aspect, a method is provided that includes singulating a molded structure on a carrier structure into separate packaged electronic devices having respective first sides on the carrier structure, and testing an electrical circuit of a selected one of the packaged electronic devices while applying heat to the second side of the selected one of the packaged electronic devices on the carrier structure.

In accordance with another aspect, a method is provided for making an electronic device. The method includes processing a semiconductor wafer, separating dies from the semiconductor wafer, attaching the dies to respective die attach pads or substrates, and performing a molding process that creates a molded structure with respective ones of the dies in corresponding device locations. The method further concludes mounting a first side of the molded structure on a carrier structure, singulating the molded structure on the carrier structure into separate packaged electronic devices having respective first sides on the carrier structure, and testing an electrical circuit of a selected one of the packaged electronic devices while applying heat to a second side of the selected one of the packaged electronic devices on the carrier structure.

BRIEF DESCRIPTION OF THE DRAWINGS

FIG. 4 is a partial sectional side elevation view of a lead frame panel with attached semiconductor dies and bond wires undergoing a molding process.

FIG. 5 is a partial sectional side elevation view of the lead frame panel with a molded structure being installed on a tape carrier.

DETAILED DESCRIPTION

Figure 1:
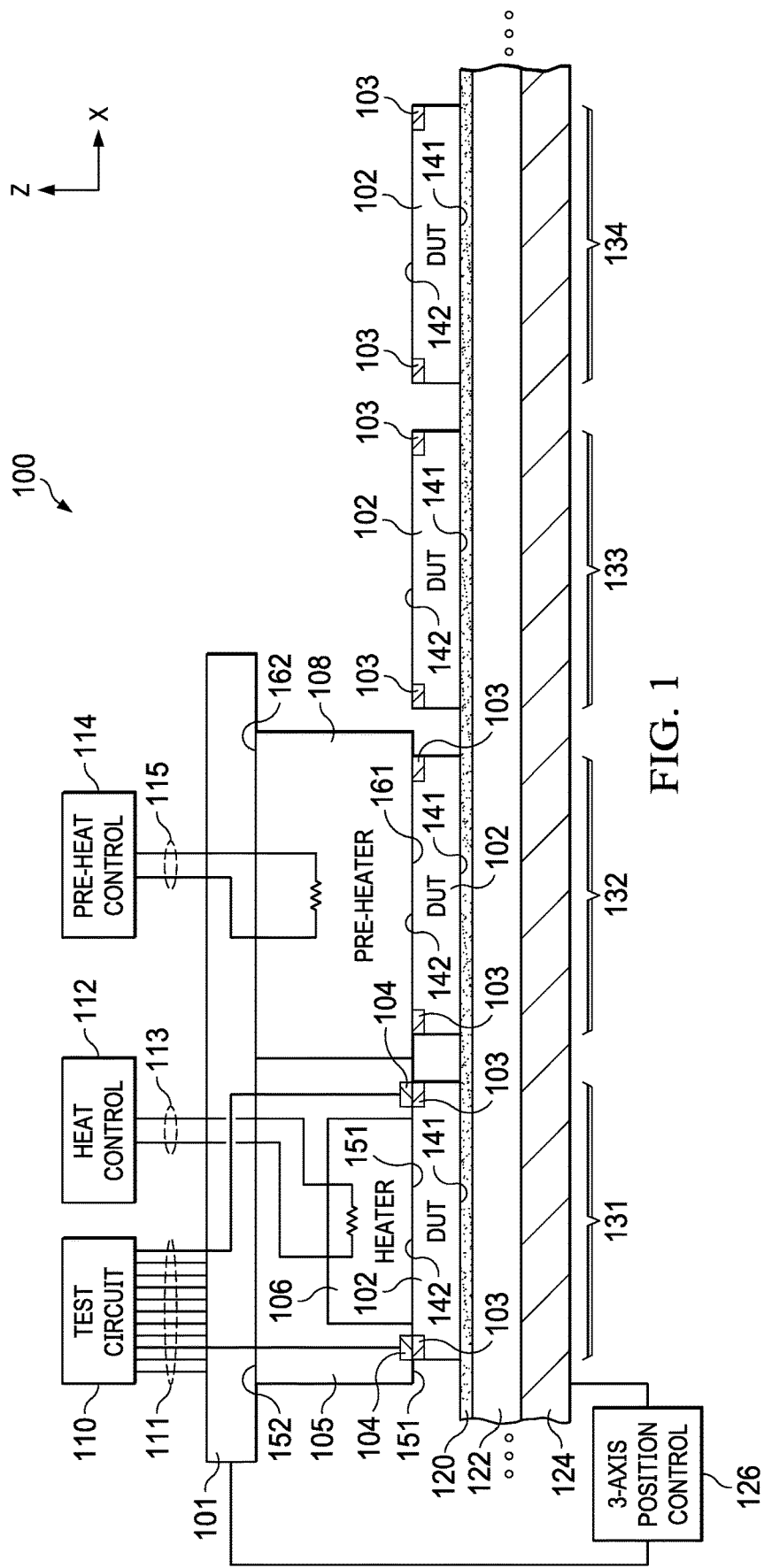
FIG. 1 is a partial sectional side elevation view of a final device test system with top side heating for testing packaged electronic devices on a tape carrier.

In the drawings, like reference numerals refer to like elements throughout, and the various features are not necessarily drawn to scale. Also, the term "couple" or "couples"

includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
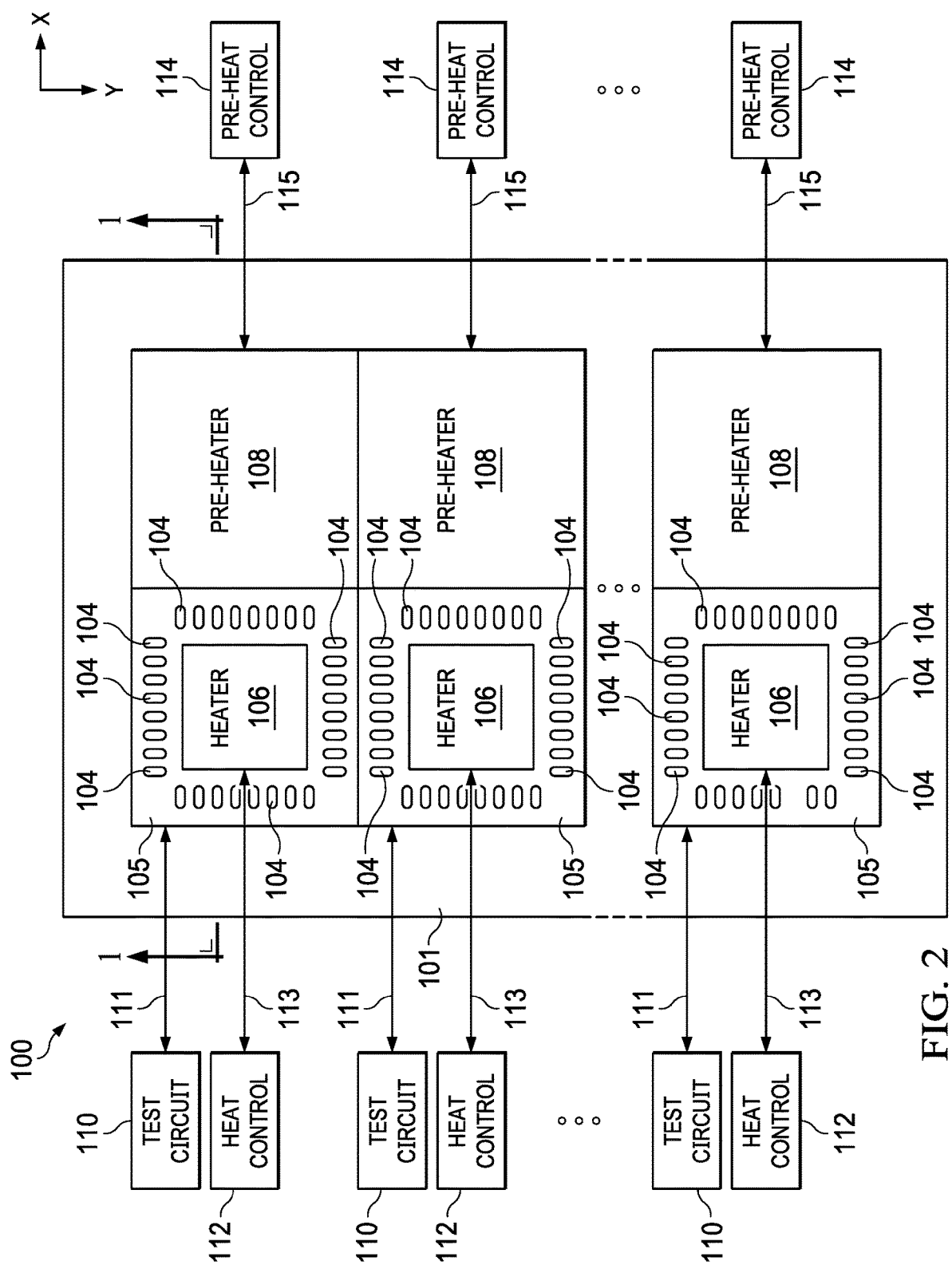
FIG. 2 is a bottom plan view of a final test probe head with heating and preheating elements in the final device test system of FIG. 1.

Referring initially to FIGS. 1 and 2, FIG. 1 shows a side view of a final device test system 100 with top side heating for testing packaged electronic devices 102 on a tape carrier, and FIG. 2 shows a bottom view of a final test probe head with heating and preheating elements in the final device test system 100 of FIG. 1. FIG. 1 shows a final device test system 100 with packaged electronic devices having first sides (e.g., bottom sides) on a tape carrier and a contactor that interfaces one or more device terminals along a second device side (e.g., the top side) for final device testing. Rather than heating a tested electronic device through the carrier, the example system 100 applies heat directly to a different device side to provide improved control over device temperature during electrical testing to implement a non-ambient final device test solution that mitigates or avoids tape carrier stretching, wrinkling stress and/or damage to the tape carrier. Although the illustrated example provides top-side heating, other examples provide heating to any side or sides of a packaged electronic device that do not interface with (e.g., do not contact) the tape carrier. In addition, although illustrated in use with an adhesive tape carrier, the example system 100 can be used in combination with other forms of carrier structure on which tested electronic devices are positioned. This facilitates use with QFN or other device package forms that can be saw cut or otherwise singulated or separated from one another while positioned on the carrier structure. Moreover, although illustrated in use with QFN packaged electronic devices, the example systems and methods can be used for non-ambient final devices testing of electronic devices having different package types. Furthermore, the electrical probing and heat application can be on the same device side (e.g., the top side in the example of FIGS. 1 and 2) or from different sides.

The system 100 in FIGS. 1 and 2 includes a stationary base 101 with apparatus to perform electrical tests on internal circuits of packaged electronic devices 102 (labeled devices under test or DUT). The packaged electronic devices 102 are not shown in FIG. 2 so as not to obscure the bottom view of the heating and preheating elements of the final test probe head. Each packaged electronic device 102 includes one or more electrically conductive terminals 103, such as copper or aluminum leads coupled to internal components or circuitry of the packaged electronic device. The packaged electronic devices 102 can be integrated circuits having multiple internal electronic components or a single electronic component (e.g., diode, transistor, etc.) with component terminals (e.g., anode, cathode, source, drain, gate, etc.) coupled to respective terminals 103 of the packaged electronic device 102.

The packaged electronic devices 102 are supported on a carrier, such as an adhesive tape or film in an adjustable frame 122. In another example, the position of the base 101 is adjustable relative to a stationary frame 122. In another example, both the base 101 and the frame 122 are movable relative to one another. In the example of FIGS. 1 and 2, the base 101 is a generally planar structure in an X-Y plane and the frame 122 is movable in three dimensions X, Y and Z relative to the base 101 to selectively position an array of the packaged electronic devices 102 beneath the base 101 in order to engage one or more terminals 103 of a selected one of the packaged electronic devices 102 with one or more respective contacts 104 of a contactor 105 mounted to the base 101. The contact 104 of the contactor 105 has an exposed surface that is adapted to engage and electrically couple to the packaged electronic device terminal 103 when the selected packaged electronic device 102 is engaged to the contactor 105. The contact 104 in one example is a spring biased pogo pin. Other forms of probe needle, pins, pads or other conductive contact structures can be used which engage and form an electrical contact to the terminal 103 of the electronic device 102.

The contactor 105 also includes a heater 106, for example, including one or more resistors to apply heat to the selected packaged electronic device 102 when engaged to the contactor 105. In one example, the heater 106 includes a molded or shaped compound material with a generally planar exposed heating surface adapted to contact a side of the selected packaged electronic device 102. The heater 106 is constructed of a thermally conductive, electrically insulating material, such as a molding compound, a ceramic material, etc. The heater 106 includes terminals adapted for coupling to a heat control circuit 112 that provides a current signal through the resistor or resistors to apply heat to an engaged packaged electronic device 102. In other examples, a non-resistive heater is used, such as a thermoelectric heater using the Peltier effect. The heater 106 in one example is encircled on four sides and a top side by the contactor 105, with the heating surface exposed on a bottom side of the contactor 105. The contacts 104 of the contactor 105 are exposed along outer peripheral portions of the bottom side of the contactor 105 and are laterally spaced outward from the heater 106. This structure allows engagement to a selected one of the packaged electronic devices 102 with the bottom side heating surface of the heater 106 providing heat to an interior portion of the bottom side of the selected packaged electronic device 102, while one or more contacts 104 of the contactor 105 are engaged to provide electrical connection from a test circuit to internal circuitry of the selected packaged electronic device 102. In this example, the test system 100 provides non-ambient temperature control while performing final electrical tests to verify acceptable operation of a manufactured packaged electronic device 102.

In the illustrated example, the system 100 includes preheating apparatus to selectively preheat one or more non-selected ones of the packaged electronic devices 102. This facilitates tamping the electronic device temperature up prior to engagement with the contactor 105 for electrical testing. In other examples, the pre-heating apparatus is omitted. The illustrated example includes a second heater 108 (labelled "PRE-HEATER") mounted to the base 101. The second heater 108 includes terminals adapted for coupling to a pre-heat control circuit 114 that provides a current signal through a resistor or resistors of the second heater 108 to apply heat to a non-selected one of the packaged electronic devices 102. In another example, the second heater 108 includes a non-resistive heater, such as a thermoelectric heater using the Peltier effect. The second heater 108 is positioned on the base 101 to contact and apply heat to a portion of a non-selected one of the packaged electronic devices 102 when the contactor 105 and the first heater 106 are engaged with a selected one of the packaged electronic devices 102. The second heater 108 in one example is sized to substantially cover an engaged non-selected one of the packaged electronic devices 102, and to cover and engage both the central portion of the non-selected packaged electronic device 102 and the conductive terminals 103 thereof, in order to provide pre-heating of the non-selected device package, as well as the circuitry thereof. The second heater 108 is constructed of a thermally conductive, electrically insulating material, such as a molding compound, a ceramic material, etc. The second heater 108 includes terminals adapted for coupling to a pre-heat control circuit that provides a current signal through the resistor or resistors to apply heat to an engaged non-selected one of the packaged electronic devices 102.

The contactor 105 and the second heater 108 in one example have lateral dimensions in the X and Y directions that substantially correspond to a pitch spacing of the packaged electronic devices 102 disposed on the underlying tape carrier structure 120. In this configuration, an array of packaged electronic devices 102 can be supported on the tape carrier structure 120 by the underlying frame 122. The frame 122 is translated to selectively position the packaged electronic devices 102 with a selected packaged electronic device 102 under the contactor 105, and with the terminals 103 aligned with the corresponding contactor contacts 104. In this position, a central portion of the selected packaged electronic device 102 is engaged with the heater 106 for heating during electrical testing. In this position, moreover, an adjacent non-selected packaged electronic device 102 is positioned to engage a bottom side of the second heater 108 for pre-heating, prior to being moved under the contactor 105 for the next test increment. In this configuration, one or more non-selected packaged electronic devices 102 are pre-heated while the selected packaged electronic device 102 is electrically tested with concurrent heat application, after previously having been pre-heated.

The system 100 also includes a test circuit 110 with electrical terminals or connections 111 that are coupled to respective ones of the contacts 104 of the contactor 105 and are routed through portions of the base 101 in the example of FIG. 1. The system 100 further includes a heat control circuit 112 with an output 113 with electrical terminals or connections that are coupled to the resistor or resistors of the heater 106. In the illustrated example, the heat control output terminals or connections are routed through the base and through a portion of the contactor 105 and the heat control output terminals or connections are electrically coupled to the resistor circuitry of the heater 106. In addition, the system 100 includes a pre-heat control circuit 114 with an output 115 having electrical terminals or connections that are coupled to the resistor or resistors of the second heater 108.

The packaged electronic devices 102 are supported on the tape carrier structure 120. The carrier structure 120 in one example is positioned on a frame 122. The system 100 includes a platform 124 having a side configured to support the frame 122 with the carrier structure 120 and the packaged electronic devices 102. The system 100 also includes a 3-axis position controller 126 that is operatively coupled to the platform 124. The position controller 126 controls a relative position of the platform 124 and the base 101 to engage the contact 104 of the contactor 105 to the terminal 103 of the selected one of the packaged electronic devices 102 on the carrier structure 120. In another example, the position controller 126 is operatively coupled to the platform 124 to control the relative positions of the platform 124 and the base 101. In another example, the position controller 126 is operatively coupled to both the platform 124 and to the base 101 and the position controller 126 controls the relative positions of the platform 104 and the base 101. Position controller 126 in one example includes mechanical actuators, robotic arms, or the like in order to control the relative positions of the platform 124 and the base 101 in three dimensional space (e.g., along the X, Y and/or Z directions in the drawings.

In the illustrated example, the tape carrier structure 120 supports an array of packaged electronic devices 102 in rows disposed along the X direction and columns disposed along the Y direction (e.g., into and out of the page in FIG. 1). FIG. 1 shows for example columns 131, 132, 133 and 134 spaced from one another along the X direction, with a corresponding column of packaged electronic devices 102 and each of the columns. As further shown in FIG. 2, the base 101 in one example has multiple contactors 105 in a first column with corresponding contacts 104 and heaters 106. This example also includes multiple adjacent pre-heaters (e.g., second heaters) 108 in a second column. This configuration allows concurrent testing and preheating of packaged electronic devices 102 in multiple rows. As discussed further below in connection with FIG. 12, moreover, additional pre-heaters (e.g., third heaters) can be provided in a third column in other examples. As mentioned previously, moreover, the pre-heater apparatus can be omitted in certain implementations. As shown in FIG. 2, the system 100 includes a test circuit 110 and a heat control circuit 112 for each of the individual contactors 105, as well as a pre-heat control circuit 114 for each of the second heaters 108. As further shown in FIG. 2, the example contactors 105 include contacts 104 (e.g., pogo pins) arranged around the peripheral sides of the respective heater 106 in locations that correspond to the lead locations of a QFN packaged electronic device 102. Each lead location in one example can include multiple contacts 104, such as a pair of electrically connected pogo pins to engage an electrically conductive terminal 103 of the selected packaged electronic device 102.

As shown in FIG. 1, the individual packaged electronic devices 102 include a first (e.g., bottom or lower) side 141, as well as a second (e.g., top or upper) side 142. The first sides 141 of the respective packaged electronic devices 102 are positioned on the carrier structure 120, for example, adhered to an adhesive tape carrier structure 120. The terminal 103 of each packaged electronic device 102 is exposed in a first portion of the respective second side 142, and the terminal 103 of each packaged electronic device 102 is coupled to an internal electrical circuit of the packaged electronic device 102, whether a single included component (e.g., a diode, transistor, etc.) or to a circuit node of an integrated circuit packaged electronic device 102. In addition, the contactor 105 has a first (e.g., bottom or lower) side 151 as well as a second (e.g., top or upper) side 152. The second side 152 of the contactor 105 is mounted to the base 101, and the contact or contacts 104 is or are coupled to the test circuit 110. As further shown in FIG. 1, the contacts 104 of the contactor 105 are exposed on a first portion of the first side 151 of the contactor 105. In addition, the contacts 104 are adapted to contact the terminal 103 in a first (laterally outward or peripheral) portion along the second side 142 of the selected one of the packaged electronic devices 102. Moreover, the heater 106 is exposed on a second (e.g., laterally outward or peripheral) portion of the first side 151 of the contactor 105. The heater 106 is adapted to contact and apply heat to a second portion of the second side 142 of the selected one of the packaged electronic devices 102. In operation, the position controller 126 is configured (e.g., by software programming, hardware logic, etc.) to move one or both of the base 101 and/or the platform 124 in order to control the relative position of the platform 124 and the base 101 to engage the contact 104 of the contactor 105 to the terminal 103 of the selected one of the packaged electronic devices 102 on the carrier structure 120.

In the illustrated system 100, the second heater 108 has a first side 161 and a second side 162. The second side 162 of the second heater 108 is mounted to the base 101. The first side 161 of the second heater 108 is adapted to contact and apply heat to all or at least a portion of the second side 142 of a non-selected one of the packaged electronic devices 102 when the heater 106 applies heat to the portion of the second side 142 of the selected one of the packaged electronic devices 102.

Figure 3:
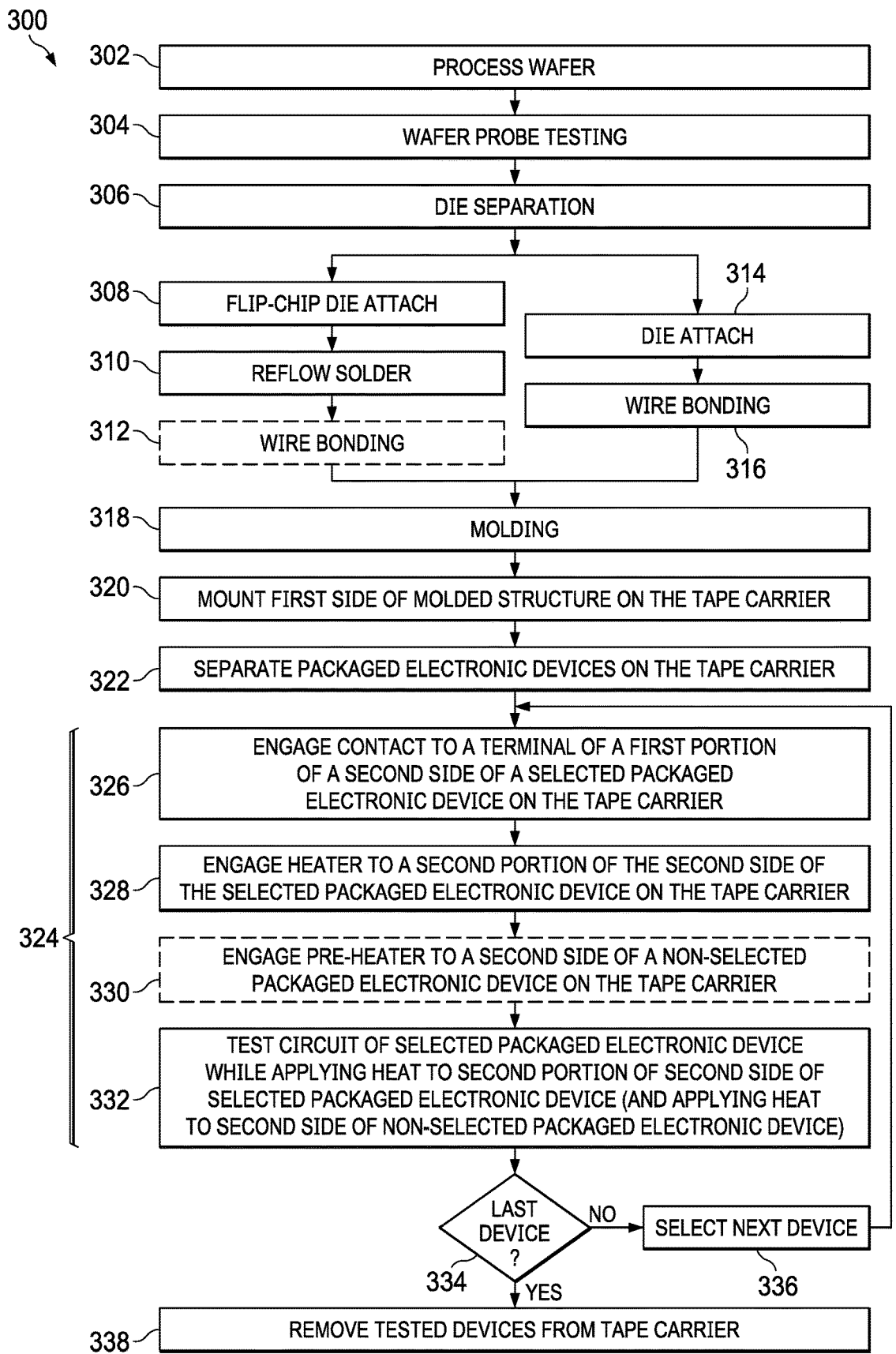
FIG. 3 is a flow diagram of a method for manufacturing packaged electronic device with final device testing using the test apparatus and system of FIGS. 1 and 2.

FIG. 3 shows a method 300 for manufacturing packaged electronic device with an included method for final device testing using the test apparatus and system of FIGS. 1 and 2. The method 300 in one example is implemented in the system 100 of FIGS. 1 and 2. In one example, the position controller 126 changes the positioning of the platform 124 relative to the base 101 between each successive column-wise testing of n selected packaged electronic devices 102 in a corresponding column on the tape carrier structure 120, and concurrent pre-heating of non-selected packaged electronic device 102 in an adjacent column. The method 300 in this example includes wafer processing at 302 to process a semiconductor wafer to form electronic components (e.g., diodes, transistors, resistors, etc.) on or in the wafer, as well as forming a metallization structure with bond pads or other conductive features exposed for circuit or device connection. The method 300 also includes wafer probe testing at 304. The method 300 continues with separating dies from the semiconductor wafer at 306.

The separated dies are attached to respective substrates or lead frame die attach pads and electrical connections are formed by wire bonding or by soldering to substrate trace routings. In one example, the dies are flip chip attached to a corresponding substrate at 308, and a solder reflow thermal process is performed at 310. In certain example, further interconnections are formed by wire bonding at 312. In another example, the wire bonding at 312 is omitted. The flip-chip die attachment at 308 attaches copper bumps of the semiconductor die to bump landings in exposed portions of a metal structure of a substrate. The bump landings in this example include conductive (e.g., copper) pillars or bumps with solder tips and liquid flux on a lower side thereof. At 310 in FIG. 3, the method 300 further includes electrical connection processing by reflowing the solder. In one example, a thermal reflow process is performed that reflows the solder wetted metal bumps to solder the metal bumps to the respective exposed portions of the conductive features of the substrate.

In another example, the separate dies are attached to corresponding die attach pads of a lead frame strip at 314, and bond wires are connected between conductive bond pads of the die and lead frame pad features. Thereafter, the method 300 includes performing a molding process at 318 to form a molded structure that encompasses multiple device locations. FIG. 4 shows a partial sectional portion of a lead frame panel or strip with attached semiconductor dies and bond wires undergoing a molding process 400. The molding process 400 creates a molded structure 402 (e.g., plastic or other electrically insulating molding compound). In one example, the molding process 400 encloses the semiconductor dies, the bond wires and portions of the lead frame in a package structure 402, such as a molding compound. The molded structure in FIG. 4 shows respective ones of the dies in the corresponding device locations corresponding to the columns 131, 132, 133 and 134 of FIG. 1. This example shows prospective device lead features 403 prior to subsequent separation, as well as die attach pads 404 and corresponding semiconductor dies 405. Bond wires 406 connect certain conductive bond pads of the dies 405 to corresponding ones of the prospective device lead features 403.

The method 300 continues at 320 in FIG. 3 with mounting a first side 141 of the molded structure on a carrier structure. FIG. 5 shows the example molded structure and the lead frame panel with the molded structure inverted and installed on the above described adhesive tape carrier structure 120. FIG. 5 also shows the carrier structure positioned on the frame 122 and supported on an upper side of the platform 124 described above in connection with FIG. 1.

Figure 6:
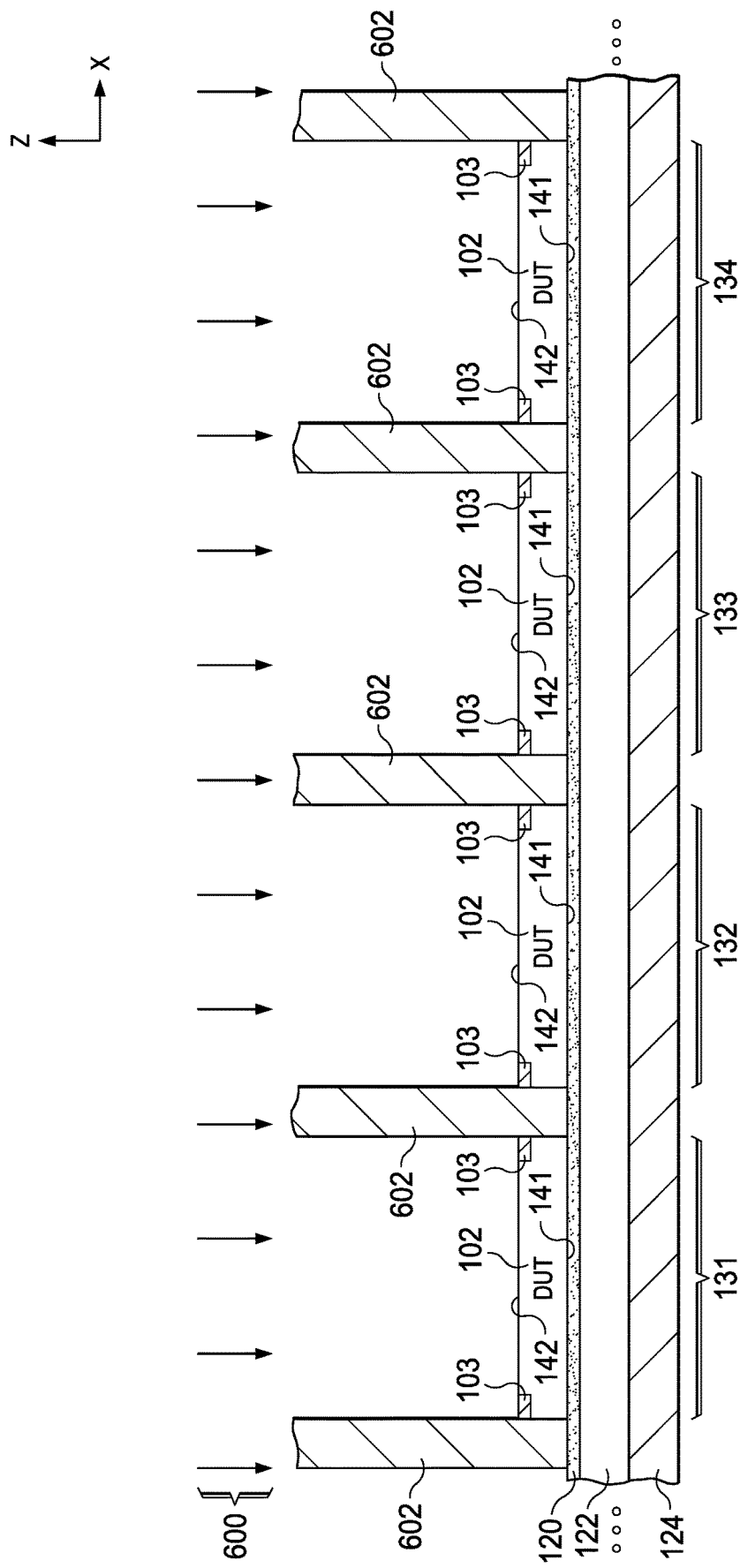
FIG. 6 is a partial sectional side elevation view of the lead frame panel undergoing a saw cutting process to separate packaged electronic devices on the tape carrier.

The molded structure is then singulated at 322 in FIG. 3 to separate individual packaged electronic devices having respective first sides 141 on the carrier structure 120. FIG. 6 shows the lead frame panel undergoing a saw cutting process 600 using saw blades 602 along the Y direction (e.g., into and out of the page in FIG. 6), and a similar cutting process is performed along the X direction to separate packaged electronic devices 102 on the tape carrier structure 120. In another example, a laser or other cutting process is performed that cuts through the lead frame and molding compound along cut lines in the X and Y directions to separate the packaged electronic devices 102 from the lead frame.

Referring also to FIGS. 7-10, the method 300 continues with final electrical testing of the separated packaged electronic device 102 at 324 in FIG. 3. This includes testing an electrical circuit of a selected one of the packaged electronic devices 102 (or a column of selected packaged electronic devices 102 in the array configuration on the tape carrier structure 120). In addition, the electrical testing is performed while the heaters 106 of the respective contactors 105 apply heat to a second side 142 of the selected ones of the packaged electronic devices 102 on the carrier structure 120. Further in this example, the electrical testing is performed while heat is applied to the second sides 142 of the non-selected packaged electronic devices 102 via the second heaters 108 in the adjacent column.

In one example, the testing at 324 includes engaging a contact at 326 to a terminal of a first portion of the second side 142 of the selected one of the packaged electronic devices 102, and engaging a heater 106 to a second portion of the second side 142 of the selected one of the packaged electronic devices 102 at 328. In one implementation, the testing at 324 further includes engaging a second heater 108 at 330 to the second side 142 of a non-selected one of the packaged electronic devices 102 on the carrier structure 120. In another example, the engagement at 330 is omitted, for example, if no pre-heating apparatus is supplied. The testing at 324 also includes applying heat at 332 to the second portion of the second side of the selected one of the packaged electronic devices 102 via the heater 106 while testing an electrical circuit of the selected one of the packaged electronic devices 102 via the contact 104 and the terminal 103. In implementations where pre-heating apparatus is used, the testing at 332 also includes applying heat to the second side 142 of the non-selected one of the packaged electronic devices 102 via the second heater 108 while testing the electrical circuit of the selected one of the packaged electronic devices 102 via the contact 104 and the terminal 103.

In one example, the heat application to the selected device 102 at 332 includes controlling the heat applied to the second portion of the second side 142 of the selected one of the packaged electronic devices 102 via the heater 106. In one example, this includes controlling a current supplied by the heat control circuit 112 to the resistor or resistors of the heater 106 in a closed loop fashion and/or controlling the time that current is supplied to the heater 106, and optionally delaying the timing of the electrical testing until a predetermined test temperature is reached. In certain implementations, the heat control circuit 112 includes or is coupled to a thermal sensor that provides a temperature feedback signal for closed loop regulation of the temperature of the selected one of the electronic devices 102. In one example, where pre-heating is employed for one or more non-selected ones of the packaged electronic devices 102, the heat application includes controlling heat applied to the second side 142 of the non-selected one of the packaged electronic devices 102 via the second heater 108 while testing the electrical circuit of the selected one of the packaged electronic devices 102, for example, including open or closed loop temperature control, pre-heat timing control, etc. In one example, this includes controlling a current supplied by the pre-heat control circuit 114 to the resistor or resistors of the second heater 108 in a closed loop fashion and/or controlling the time that current is supplied to the second heater 108. In one implementation, the pre-heat control circuit 114 includes or is coupled to a thermal sensor that provides a temperature feedback signal for closed loop regulation of the pre-heating temperature of the non-selected one of the electronic devices 102.

Once the selected packaged electronic device or devices 102 has or have been tested at non-ambient temperature, the test system 100 determines at 334 whether all packaged electronic devices 102 of a given carrier structure array have undergone final electrical testing. If not (NO at 334), the position controller 126 moves the platform 124 by one column width to align the adjacent column 132 with the contactor 105 to select the next electronic device (or the next column of devices 102) at 336, and the method 300 repeats the processing at 324 as described above for the newly selected one of the packaged electronic devices 102. Once all the electronic devices 102 have been tested (YES at 334), the tested devices 102 are removed from the carrier structure 120 at 338.

Figure 7:
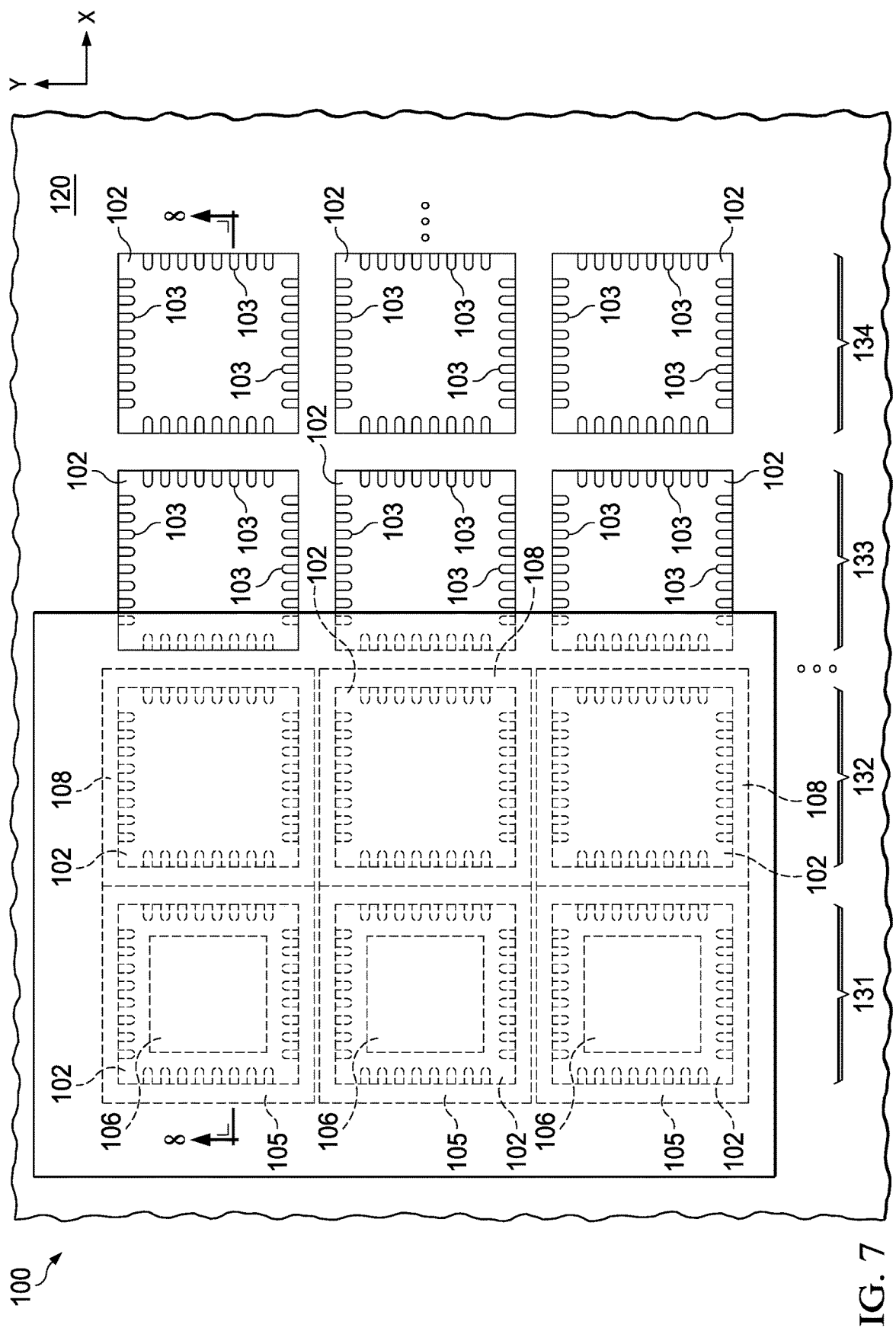
FIG. 7 is a partial top plan view of the separated packaged electronic devices on the tape carrier undergoing a final device test process using the test apparatus and system of FIGS. 1 and 2 to test a first column of packaged electronic devices while pre-heating an adjacent second column of packaged electronic devices.
Figure 8:
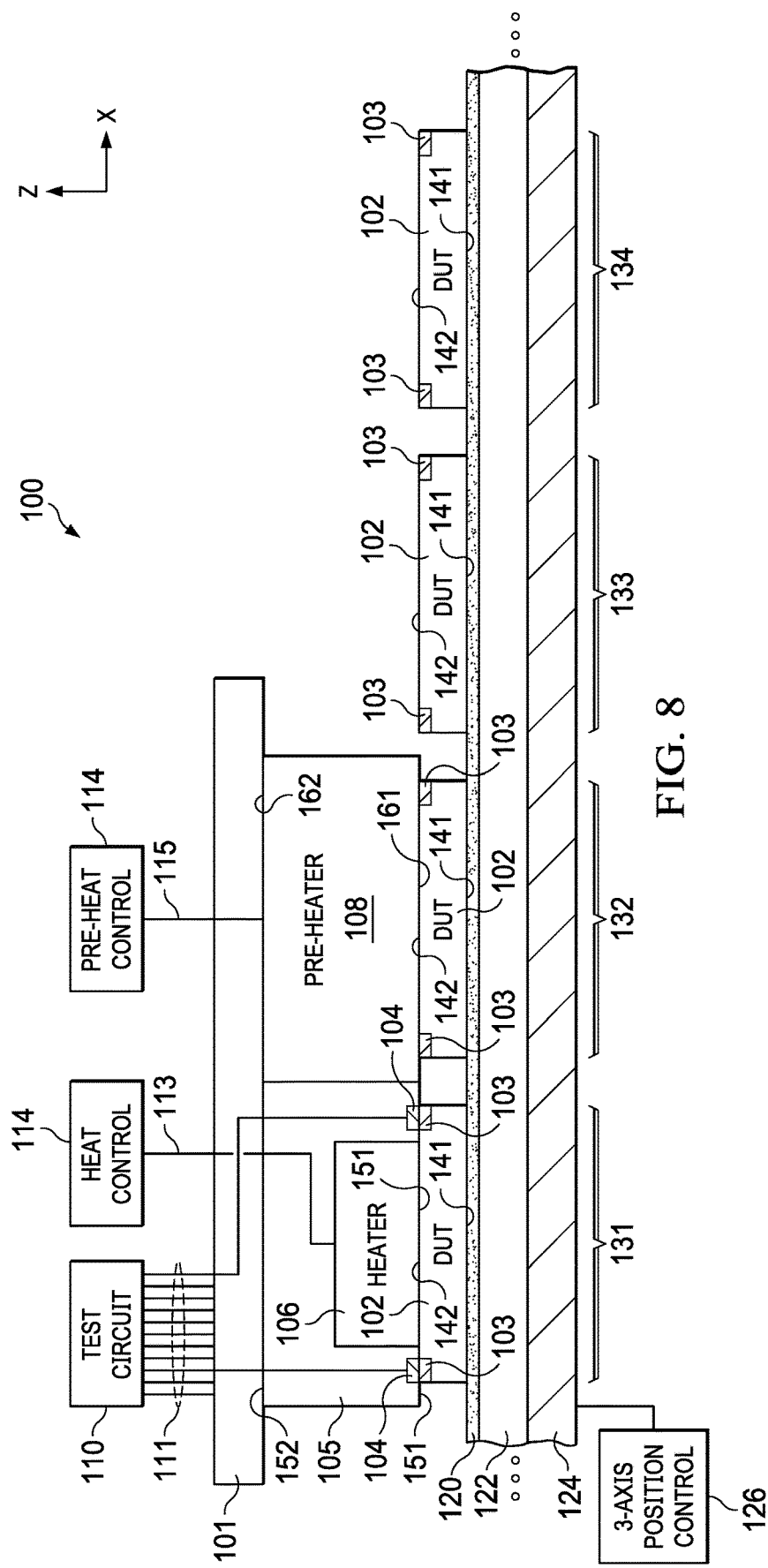
FIG. 8 is a partial sectional side elevation view of the separated packaged electronic devices on the tape carrier undergoing the final device test process taken along line 8-8 in FIG. 7 with a heated test structure engaging a packaged electronic device in the first column and a pre-heating structure engaging a packaged electronic device in the adjacent second column.

FIGS. 7 and 8 show the example system 100 during testing of a selected first column 131 of packaged electronic devices 102 with a heated test structure engaging a packaged electronic device 102 in the first column 131, and a pre-heating structure engaging a packaged electronic device 102 in the adjacent second column 132. FIG. 7 shows a top view of the separated packaged electronic devices 102 on the tape carrier structure 120 undergoing a final device test process (e.g., 324 in FIG. 3) using the test system 100 of FIGS. 1 and 2. FIG. 8 shows a sectional side view of the separated packaged electronic devices 102 on the tape carrier undergoing the final device test process taken along line 8-8 in FIG. 7. In this example, the selected device contacts 104 are engaged to respective terminals 103 of the first portion of the second side 142 of the selected one of the packaged electronic devices 102 in the first column 131 (326 in FIG. 3). The bottom side 151 of the heater 106 engages an inner portion of the top side of the selected one of the packaged electronic devices 102 to provide concurrent heat application and electrical testing. In this example, the bottom side 161 of the second heater 108 engages the top side 142 of the non-selected packaged electronic device 102 of the second column 132 to pre heat the non-selected packaged electronic device 102 while the selected one of the packaged electronic devices 102 in the first column 131 is tested.

Figure 9:
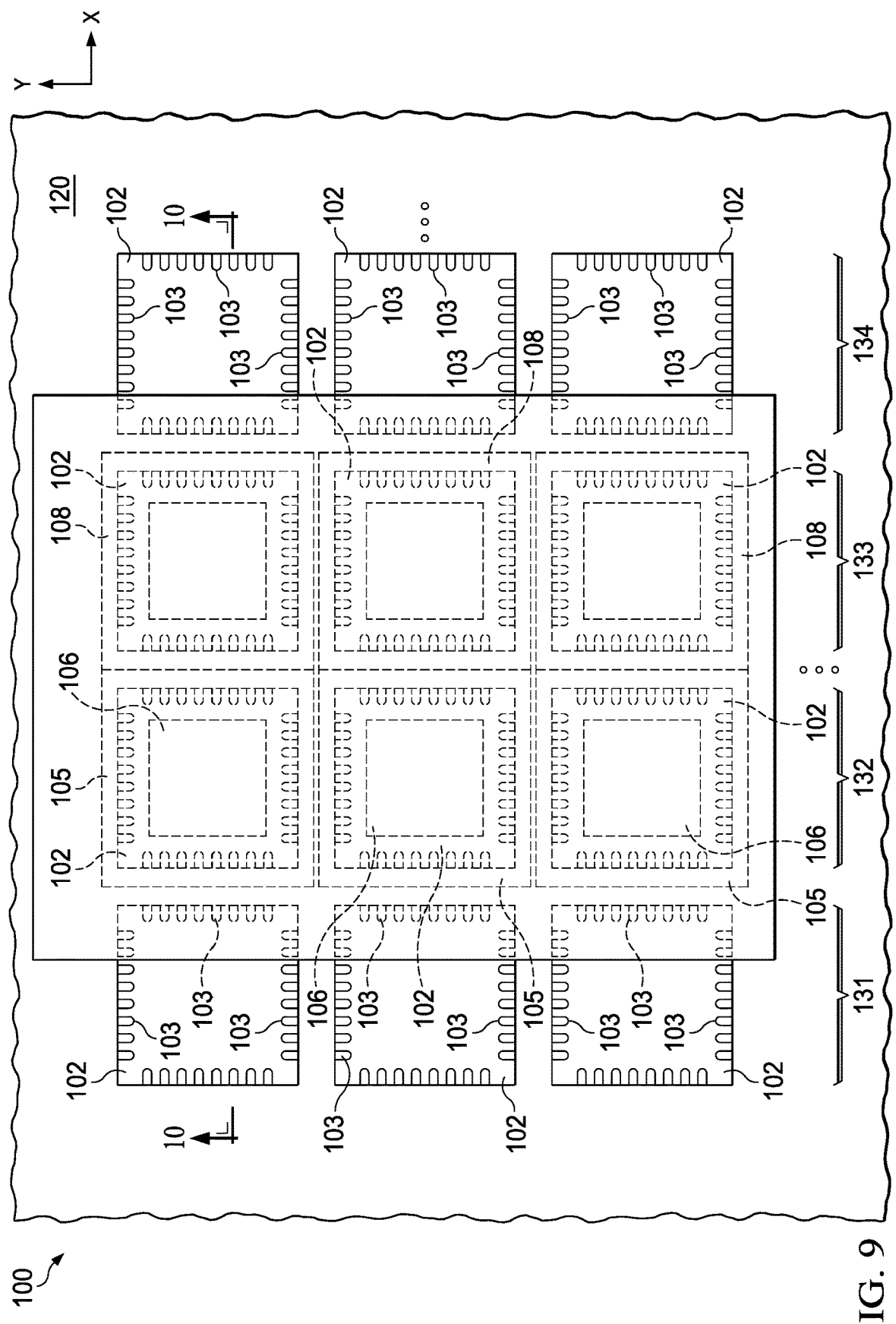
FIG. 9 is a partial top plan view of the separated packaged electronic devices on the tape carrier undergoing the final device test process using the test apparatus and system of FIGS. 1 and 2 to test the second column of packaged electronic devices while pre-heating an adjacent third column of packaged electronic devices.
Figure 10:
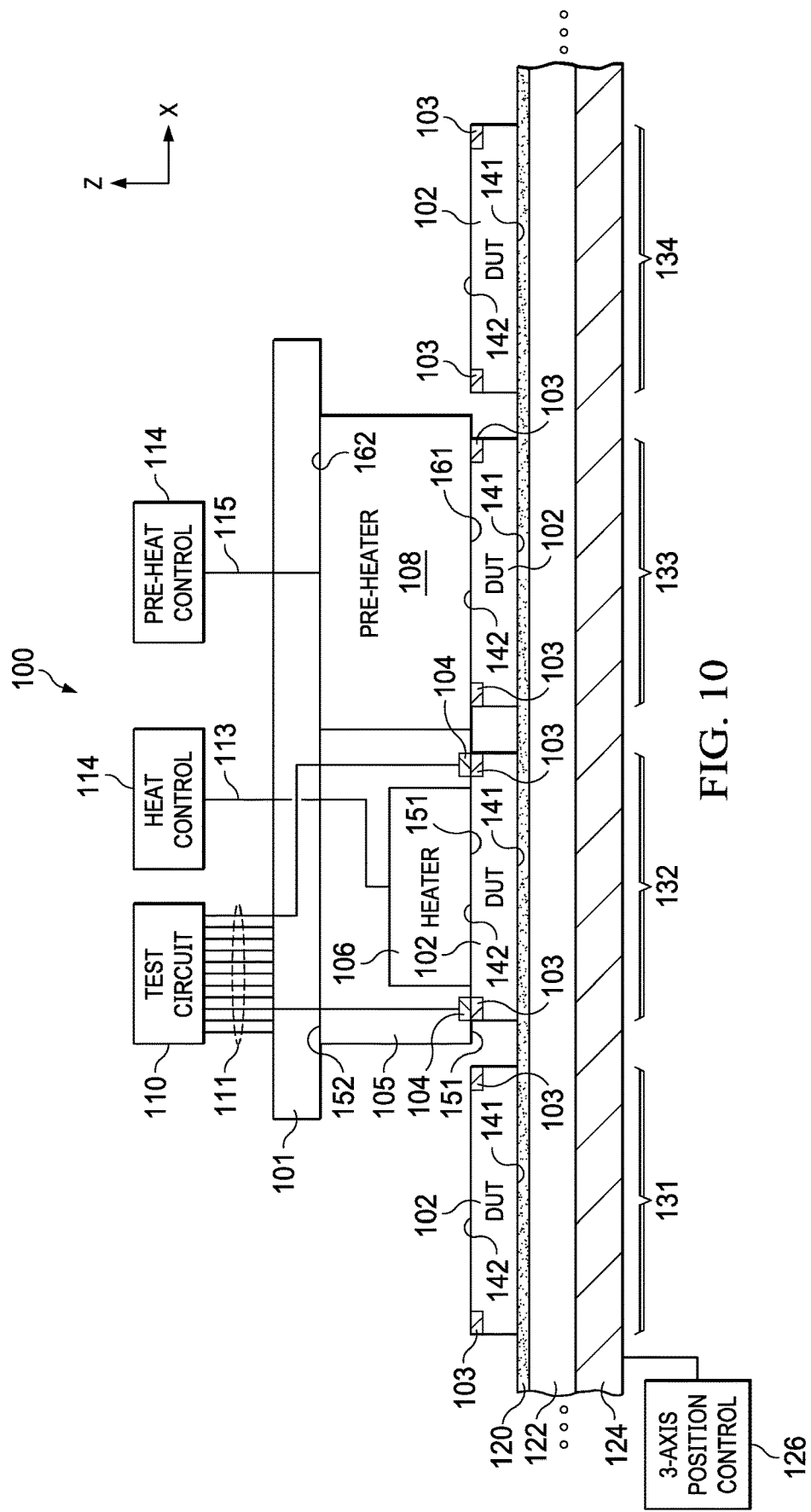
FIG. 10 is a partial sectional side elevation view of the separated packaged electronic devices on the tape carrier undergoing the final device test process taken along line 10-10 in FIG. 9 with the heated test structure engaging a packaged electronic device in the second column and the pre-heating structure engaging a packaged electronic device in the adjacent third column.

FIGS. 9 and 10 show the system 100 after the position controller 126 has moved the platform 124 to the left by one column width to select the next electronic device (or the next column of devices 102) of the second column 132 (e.g., 336 in FIG. 3 above). Although the illustrated example moves by one column, other examples are possible, for example, in which the test array, and therefore the pre-heating array could be any shape, and possibly have multiple columns with contactors, and the incremental moves could be could be two or more columns, or the movement could be half a column and one or more rows, or combinations thereof. FIG. 9 shows the top view of the separated packaged electronic devices 102 on the tape carrier structure 120 undergoing the final device test process using the system 100 to test the second column 132 of packaged electronic devices 102 while pre-heating the packaged electronic devices 102 of the third column 133. FIG. 10 shows the separated packaged electronic devices 102 on the tape carrier structure 120 undergoing the final device test process taken along line 10-10 in FIG. 9 with the heated test structure 105, 106 engaging a packaged electronic device 102 in the second column 132 and the pre-heating structure 108 engaging a packaged electronic device 102 in the adjacent third column 133.

Figure 11:
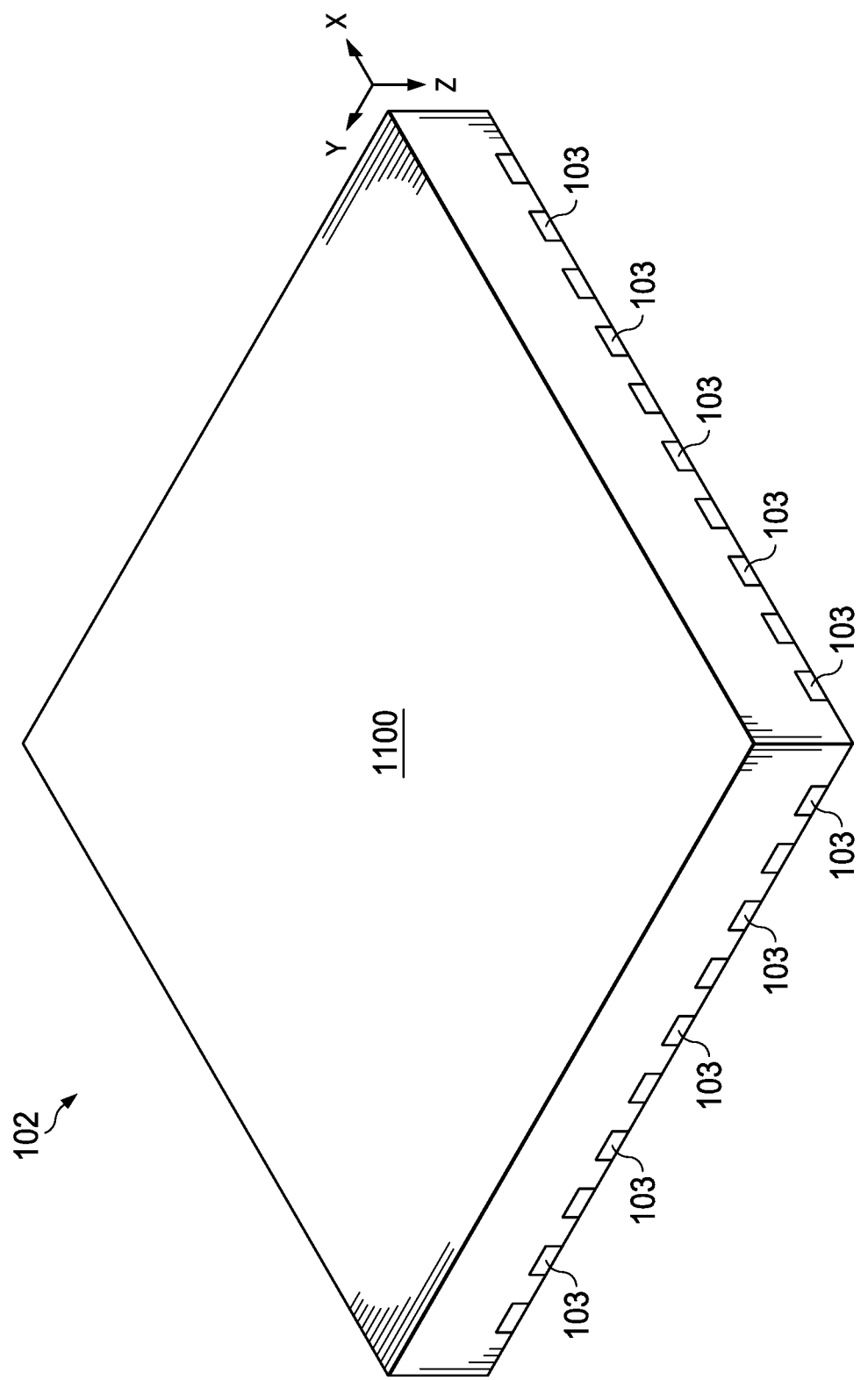
FIG. 11 is a perspective view of a packaged electronic device produced according to the method of FIG. 3.

FIG. 11 shows a packaged electronic device 102 produced according to the method 300 of FIG. 3. In this example, the finished electronic device 102 is a QFN device with a molded package structure 1100 (e.g., molding compound). The packaged electronic device 102 has eight leads or terminals 103 on each of four lateral sides, and these are exposed along a bottom side to allow soldering to a host printed circuit board (PCB, not shown).

Figure 12:
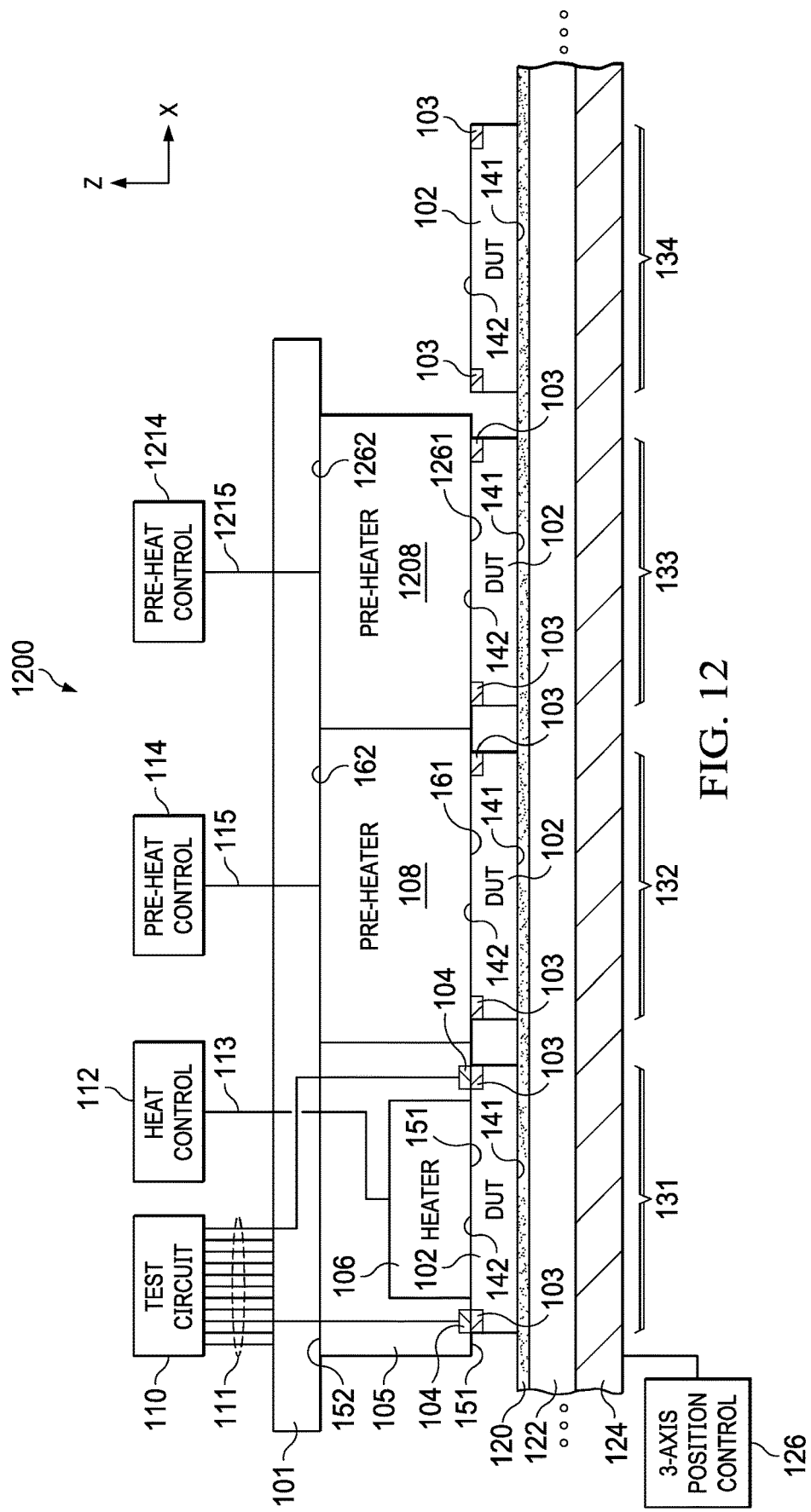
FIG. 12 is a partial sectional side elevation view of the separated packaged electronic devices on the tape carrier of FIG. 6 undergoing a final device test process another example test apparatus and system having a heated test structure engaging a packaged electronic device in the first column and first and second pre-heating structures engaging packaged electronic devices in the respective second and third columns.

FIG. 12 shows another example of a final test system 1200, in which the separated packaged electronic devices 102 on the tape carrier structure 120 undergoes a final device test process. In this example, the system 1200 includes the base 101, contactor 105 and second heater 108, as well as the circuits and controllers 110, 112, 114 and 126 as described above. In addition, the system 1200 of FIG. 12 also includes a third heater 1208 having a first side 1261 and a second side 1262. The second side 1262 of the third heater 1208 is mounted to the base 101. The first side 1261 of the third heater 1208 is adapted to contact and apply heat to a portion of the second side 142 of a second non-selected one of the packaged electronic devices 102 when the heater 106 applies heat to the portion of the second side 142 of the selected one of the packaged electronic devices 102. The final test system 1200 includes a second pre-heat control circuit 1214 with an output 1215 having electrical terminals or connections that are coupled to a resistor or resistors of the third heater 1208. In one example, the third heater 1208 applies heat to the second side 142 of a second non-selected one of the packaged electronic devices 102 (e.g., in the third column 133 in the positioning of FIG. 12) while the system 1200 tests the electrical circuit of the selected one of the packaged electronic devices 102 in the first column 131 via the contacts 104 and the terminals 103.

The described example systems 100, 1200 and method 300 provide a solution for non-ambient temperature electrical testing of packaged electronic devices 102 on a carrier structure 120 without heating the tape carrier 120, thereby mitigating or avoiding the previously mentioned stress, wrinkling and other adverse effects on the carrier structure 120. The described examples avoid exposing the carrier structure 120 to damaging thermal stress and prevent having the tape in the conductive path of heat energy between the heat source and the devices 102 being tested. Rather than heating the devices 102 through the carrier structure 120, the example systems 100, 1200 provide the heater 106 integrated into the body of the contactor 105. Certain examples also include one or more pre-heating stages, such as the second heater 108 and the example third heater 1208 positioned to pre-heat upcoming packaged electr5onic device units to be tested. This feature reduces testing time and production cost by reducing the time spent waiting for a thermal soak/heat cycle for each stage of final testing. Instead, the described examples facilitate beginning electrical testing shortly after contactor engagement as the selected packaged electronic device has been previously brought to or near the desired testing temperature. Moreover, the described examples provide more direct application of heat to the packaged electronic devices 102 without an intervening carrier tape structure, and thus provide improved control over the actual device temperature. In certain examples, the size, heating level, and number of pre-heaters can be tailored in a given application, for example, as a function of thermal resistance and capacitance of the units under test and the total temperature swing required. In addition, the described examples mitigate or avoiding excessive thermal stress on the packaged electronic devices 102, because the devices 102 will get hot, but not all of them at once. The described techniques and systems provide significant advantages for electrical testing of devices having QFN and other package types where the package separation is performed with the devices 102 on the carrier structure 120, and the array of separated devices are tested at non-ambient temperature while remaining on the carrier structure 120. Moreover, the described examples heat parts for strip testing by heating on the lead side of the DUTs, whereas other strip solutions heat the parts on the top (non-lead) side of the devices 102, and the heat is transferred through the tape carrier 120. The illustrated testing solutions and methods can be used in high throughput production testing, and can be used for testing very small devices, such as QFN packages in strip form using automated final test equipment, while allowing improved thermal device testing with improved control of the temperature of the devices under test relative to any solution that conducts heat energy through the tape, and the disclosed examples can be implemented using existing production equipment.

Modifications are possible in the described examples, and other implementations are possible, within the scope of the claims.

What is claimed is:

1. A system, comprising:
    a platform having a side configured to support a frame with a carrier structure and packaged electronic devices, each packaged electronic device having a first side, a second side, and a terminal, the first side of each packaged electronic device being positioned on the carrier structure, the terminal of each packaged electronic device being exposed in a first portion of the respective second side, and the terminal of each packaged electronic device being coupled to an electrical circuit of the packaged electronic device; and
    a contactor having a first side, a second side, a contact and a heater, the second side being mounted to a base, the contact being coupled to a test circuit and being exposed on a first portion of the first side of the contactor, the contact being adapted to contact the terminal in the first portion of a selected one of the packaged electronic devices, and the heater being exposed on a second portion of the first side of the contactor and adapted to apply heat to a second portion of the second side of the selected one of the packaged electronic devices.

2. The system of claim 1, further comprising a position controller coupled to one of the platform and the contactor, the position controller being configured to control a relative position of the platform and the base to engage the contact of the contactor to the terminal of the selected one of the packaged electronic devices on the carrier structure.

3. The system of claim 1, further comprising a second heater having a first side and a second side, the second side of the second heater being mounted to the base, and the first side of the second heater being adapted to contact and apply heat to a portion of the second side of a non-selected one of the packaged electronic devices when the heater applies heat to the portion of the second side of the selected one of the packaged electronic devices.

4. The system of claim 3, further comprising:
    a first heat control circuit having an output coupled to the heater; and
    a second heat control circuit having an output coupled to the second heater.

5. The system of claim 3, further comprising:
    a third heater having a first side and a second side, the second side of the third heater being mounted to the base, and the first side of the third heater being adapted to apply heat to a portion of the second side of a second non-selected one of the packaged electronic devices when the heater applies heat to the portion of the second side of the selected one of the packaged electronic devices.

6. The system of claim 5, further comprising:
    a first heat control circuit having an output coupled to the heater;
    a second heat control circuit having an output coupled to the second heater; and
    a third heat control circuit having an output coupled to the third heater.

7. A method, comprising:
    singulating a molded structure on a carrier structure into separate packaged electronic devices having respective first sides on the carrier structure; and
    testing an electrical circuit of a selected one of the packaged electronic devices while applying heat to a second side, but not the first side, of the selected one of the packaged electronic devices on the carrier structure.

8. A method, comprising:
    singulating a molded structure on a carrier structure into separate packaged electronic devices having respective first sides on the carrier structure;
    engaging a contact to a terminal of a first portion of athe second side of a selected one of the packaged electronic devices;
    engaging a heater to a second portion of the second side of the selected one of the packaged electronic devices; and
    testing an electrical circuit of the selected one of the packaged electronic devices while applying the heat to the second side of the selected one of the packaged electronic devices via the heater while testing the electrical circuit of the selected one of the packaged electronic devices via the contact and the terminal.

9. The method of claim 8, further comprising:
    applying heat to the second side of a non-selected one of the packaged electronic devices while testing the electrical circuit of the selected one of the packaged electronic devices via the contact and the terminal.

10. The method of claim 9, further comprising:
engaging a second heater to the second side of the non-selected one of the packaged electronic devices on the carrier structure; and
applying the heat to the second side of the non-selected one of the packaged electronic devices via the second heater while testing the electrical circuit of the selected one of the packaged electronic devices via the contact and the terminal.

11. The method of claim 10, further comprising:
controlling the heat applied to the second portion of the second side of the selected one of the packaged electronic devices via the heater while testing the electrical circuit of the selected one of the packaged electronic devices via the contact and the terminal; and
controlling the heat applied to the second side of the non-selected one of the packaged electronic devices via the second heater while testing the electrical circuit of the selected one of the packaged electronic devices via the contact and the terminal.

12. The method of claim 9, further comprising:
applying heat to the second side of a second non-selected one of the packaged electronic devices while testing the electrical circuit of the selected one of the packaged electronic devices via the contact and the terminal.

13. The method of claim 12, further comprising:
engaging a third heater to the second side of the second non-selected one of the packaged electronic devices on the carrier structure; and
applying the heat to the second side of the second non-selected one of the packaged electronic devices via the third heater while testing the electrical circuit of the selected one of the packaged electronic devices via the contact and the terminal.

14. The method of claim 7, further comprising:
applying heat to the second side of a non-selected one of the packaged electronic devices while testing the electrical circuit of the selected one of the packaged electronic devices via the contact and the terminal.

15. The method of claim 14, further comprising:
engaging a second heater to the second side of the non-selected one of the packaged electronic devices on the carrier structure; and
applying the heat to the second side of the non-selected one of the packaged electronic devices via the second heater while testing the electrical circuit of the selected one of the packaged electronic devices via the contact and the terminal.

16. The method of claim 14, further comprising:
applying heat to the second side of a second non-selected one of the packaged electronic devices while testing the electrical circuit of the selected one of the packaged electronic devices via the contact and the terminal.

17. A method of making an electronic device, the method comprising:
processing a semiconductor wafer;
separating dies from the semiconductor wafer;
attaching the dies to respective die attach pads or substrates;
performing a molding process that creates a molded structure with respective ones of the dies in corresponding device locations;
mounting a first side of the molded structure on a carrier structure;
singulating the molded structure on the carrier structure into separate packaged electronic devices having respective first sides on the carrier structure; and
testing an electrical circuit of a selected one of the packaged electronic devices while applying heat to a second side, but not the first side, of the selected one of the packaged electronic devices on the carrier structure.

18. A method of making an electronic device, the method comprising:
processing a semiconductor wafer;
separating dies from the semiconductor wafer;
attaching the dies to respective die attach pads or substrates;
performing a molding process that creates a molded structure with respective ones of the dies in corresponding device locations;
mounting a first side of the molded structure on a carrier structure;
singulating a molded structure on a carrier structure into separate packaged electronic devices having respective first sides on the carrier structure;
engaging a contact to a terminal of a first portion of a second side of a selected one of the packaged electronic devices;
engaging a heater to a second portion of the second side of the selected one of the packaged electronic devices; and
testing an electrical circuit of the selected one of the packaged electronic devices while applying the heat to the second side of the selected one of the packaged electronic devices via the heater while testing the electrical circuit of the selected one of the packaged electronic devices via the contact and the terminal.

19. The method of claim 18, further comprising:
applying heat to the second side of a non-selected one of the packaged electronic devices while testing the electrical circuit of the selected one of the packaged electronic devices via the contact and the terminal.

20. The method of claim 17, further comprising:
applying heat to the second side of a non-selected one of the packaged electronic devices while testing the electrical circuit of the selected one of the packaged electronic devices via the contact and the terminal.

21. A method, comprising:
singulating a molded structure on a carrier structure into separate packaged electronic devices having respective first sides on the carrier structure; and
testing an electrical circuit of selected ones of the packaged electronic devices while applying heat to second sides, but not the first sides, of the selected packaged electronic devices on the carrier structure.

22. A method of making an electronic device, the method comprising:
processing a semiconductor wafer;
separating dies from the semiconductor wafer;
attaching the dies to respective die attach pads or substrates;
performing a molding process that creates a molded structure with respective ones of the dies in corresponding device locations;
mounting a first side of the molded structure on a carrier structure;
singulating the molded structure on the carrier structure into separate packaged electronic devices having respective first sides on the carrier structure; and
testing an electrical circuit of selected ones of the packaged electronic devices while applying heat to second sides, but not first sides, of the selected packaged electronic devices on the carrier structure.

* * * * *